United States Patent [19]

Erie et al.

[11] Patent Number: 4,717,449
[45] Date of Patent: Jan. 5, 1988

[54] DIELECTRIC BARRIER MATERIAL

[75] Inventors: David G. Erie, Cottage Grove; Jon A. Roberts, Minnetonka; Eddie C. Lee, Bloomington, all of Minn.

[73] Assignee: Honeywell Inc., Minneapolis, Minn.

[21] Appl. No.: 890,874

[22] Filed: Jul. 25, 1986

Related U.S. Application Data

[63] Continuation of Ser. No. 603,861, Apr. 25, 1984, abandoned.

[51] Int. Cl.$^4$ .................. H01L 21/306; B44C 1/22; C03C 15/00; C03C 25/06
[52] U.S. Cl. .................. 437/195; 204/129.1; 156/644; 156/646; 156/653; 156/657; 156/667; 156/643; 357/71
[58] Field of Search .............. 156/643, 644, 646, 652, 156/653, 656, 657, 659.1, 661.1, 662, 667; 29/580, 591; 148/1.5, 187; 252/79.1; 427/88–91; 357/65, 71

[56] References Cited

U.S. PATENT DOCUMENTS

| | | | |
|---|---|---|---|
| 3,868,723 | 2/1975 | Lechaton et al. | 204/192 E X |
| 4,172,004 | 10/1979 | Alcorn et al. | 156/643 X |
| 4,203,800 | 5/1980 | Kitcher et al. | 252/79.1 X |
| 4,242,698 | 12/1980 | Ghate et al. | 357/71 |
| 4,289,574 | 9/1981 | Radigan et al. | 156/643 |
| 4,289,834 | 9/1981 | Alcorn et al. | 357/71 X |
| 4,322,264 | 3/1982 | Rioult et al. | 156/667 X |
| 4,367,119 | 1/1983 | Logan et al. | 156/653 X |
| 4,455,194 | 6/1984 | Yabu et al. | 156/657 X |
| 4,495,220 | 1/1985 | Wolf et al. | 156/644 X |
| 4,507,851 | 4/1985 | Joyner et al. | 156/657 X |
| 4,507,852 | 4/1985 | Karulkar | 357/71 X |
| 4,514,251 | 4/1985 | Van Ommen et al. | 156/662 X |
| 4,523,372 | 6/1985 | Balda et al. | 357/71 X |

OTHER PUBLICATIONS

Logan, J. S. et al., ". . . Etch Stop for Memory Metallization; Large-Small via Etch Sequence", IBM Tech. Discl. Bulletin, vol. 23, No. 7B, Sep. 1980, 3213–3215.
Kitcher, J. R., "Integral Stud for Multilevel Metal", IBM Tech. Discl. Bulletin, vol. 23, No. 4, Sep. 1980, pp. 1395.
Hitchner, J. E. et al., "Chromium as an RIE Etch Barrier", IBM Tech. Discl. Bulletin, vol. 22, No. 10, Mar. 1980, pp. 4516–4517.

*Primary Examiner*—William A. Powell
*Attorney, Agent, or Firm*—William T. Udseth

[57] ABSTRACT

Disclosed is a method of fabricating an integrated circuit. A substrate comprising a semiconductor material and having a first surface is provided. A first layer of metalization interconnects is formed on the first surface. A first thin film layer comprising a dielectric barrier material is deposited over the first layer of metalization interconnects. A second thin film layer comprising a dielectric passivating material is deposited over the first thin film layer of dielectric barrier material. A via having a width greater than the width of a metalization interconnect is then plasma etched in the dielectric passivating material using a first etch gas. The dielectric barrier material is then plasma etched using a second etch gas to remove the dielectric barrier material in the area of the via. A second layer of metalization interconnects is then formed, a metalization interconnect in each of the first and second layers of metalization interconnects being connected in the via.

29 Claims, 7 Drawing Figures

DIELECTRIC BARRIER MATERIAL

This application is a continuation of application Ser. No. 603,861, filed Apr. 25, 1984, now abandoned.

The Government has rights in this invention pursuant to Contract No. F33615-81-C-1527 awarded by the Department of the Air Force.

BACKGROUND OF THE INVENTION

The present invention relates to the processing of integrated circuits and, more particularly, to the use of a dielectric barrier material under a dielectric passivating material in order to effectively process oversized vias in multilayer metalization structures.

Previous methods of making via interconnections in integrated circuits required placing a via opening totally within a pad of an underlying metal. This metal acted as a stop for the etching of the passivating dielectric. The pad had to be large enough to facilitate easy alignment of the dielectric lithographic pattern to the metal pattern and to allow for overetching of the dielectric material.

Integrated circuits formed in accordance with the present invention do not require a pad of underlying metal but allow for the via to be oversized. That is, the via opening can overlap the metalization.

Integrated circuits are designed according to applicable minimum and maximum layout rules. In metalization layers, the spacing of metal features is determined by the smallest gap that can be patterned into the metal. In prior art via approaches, the pad-to-pad spacing determined the separation of metal runners. Using an oversized via, the spacing between metal runners can be reduced to the minimum metal-to-metal space that can be patterned.

For large scale integrated circuits, one of the major limiting factors of circuit densities is the spacing between thin film metalization interconnects. This limitation exists for every layer of metal on an integrated circuit; therefore elimination of metal via pads increases circuit densities.

SUMMARY OF THE INVENTION

The present invention comprises a method of fabricating an integrated circuit. A substrate comprising a semiconductor material and having a first surface is provided. A first layer of metalization interconnects is formed on the first surface. A first thin film layer comprising a dielectric barrier material is deposited over the first layer of metalization interconnects. A second thin film layer comprising a dielectric passivating material is deposited over the first thin film layer of dielectric barrier material. A via having a width greater than the width of a metalization interconnect is then plasma etched in the dielectric passivating material using a first etch gas. The dielectric barrier material is then plasma etched using a second etch gas to remove the dielectric barrier material in the area of the via. A second layer of metalization interconnect in each of the first and second layers of metalization interconnects being connected in the via.

BRIEF DESCRIPTION OF THE DRAWINGS

The FIGS. (1–7) illustrate steps of fabricating an integrated circuit in accordance with the present invention.

DESCRIPTION OF THE PREFERRED EMBODIMENTS

Figure 1:
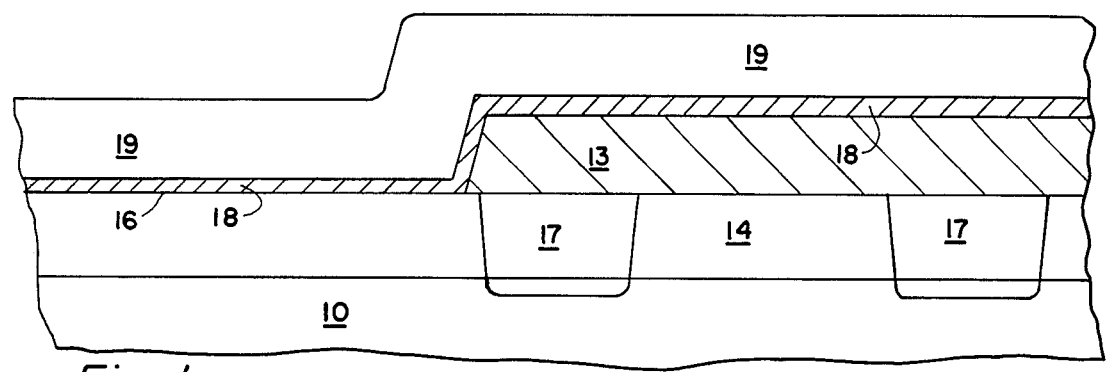

FIG. 1 illustrates a substrate comprising a semiconductor body 10 of, for example, Si and a dielectric layer 14 such as $SiO_2$. The substrate comprises a major surface 16 exposing semiconductor devices 17 formed into the substrate.

A first layer of metalization interconnects 13 is formed on first surface 16 by standard processing techniques such as depositing a first layer of metal 13, photopatterning the metal, and etching the metal to form interconnects 13.

In accordance with the present invention a first thin film layer 18 comprising a dielectric barrier material is then deposited over the first layer of metalization interconnects 13. Dielectric barrier material 18 may comprise $Ti_xO_y$ wherein x and y equal the relative amounts of Ti and O respectively. Such a layer, e.g., of $Ti_xO_y$ may be formed by processes well known in the art, e.g., by RF reactive sputtering of Ti in an Ar-$O_2$ atmosphere (using 90% Argon and 10% oxygen at a pressure of 12 mTorr and an average power density of 4 w/cm$^2$).

For reasons to be explained subsequently, it is preferred that first thin film layer 18 comprising the dielectric barrier material be formed to a thickness of approximately 500 angstroms or less.

Using processing well known in the art, a second thin film layer 19 comprising a dielectric passivating material is then deposited over first thin film layer 18 of dielectric barrier material. Such a layer 19 may comprise $SiO_2$ which may be sputter deposited in situ or formed by chemical vapor deposition in a separate system.

Figure 2:
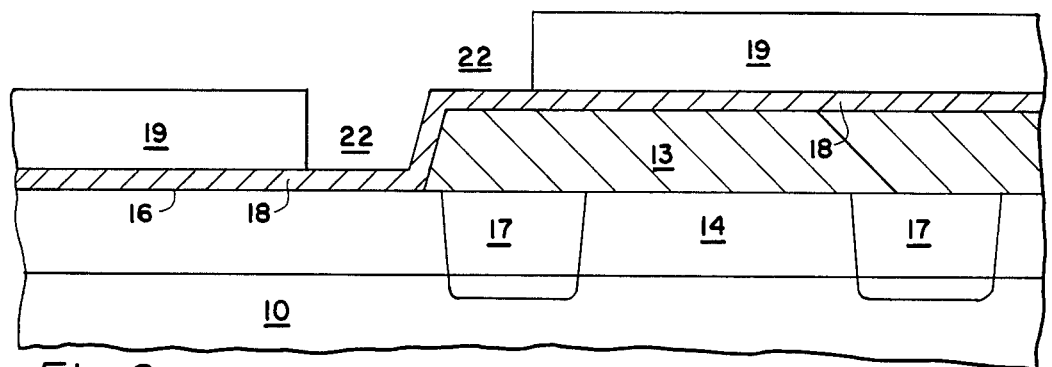

As illustrated in FIG. 2 (and the top views of FIG. 5 and 7), a via 22 is then plasma etched in second dielectric layer 19 using a first etch gas. This plasma etching step may be accomplished in accordance with processes well known in the art, e.g., in the case of a layer 19 comprising $SiO_2$, in a gas mixture of 50% $CHF_3$:45.9$CF_4$:4.1$O_2$. Via 22 may be oversized, having a width 23 greater than the width 24 of a first level metalization interconnect 13.

Figure 5:
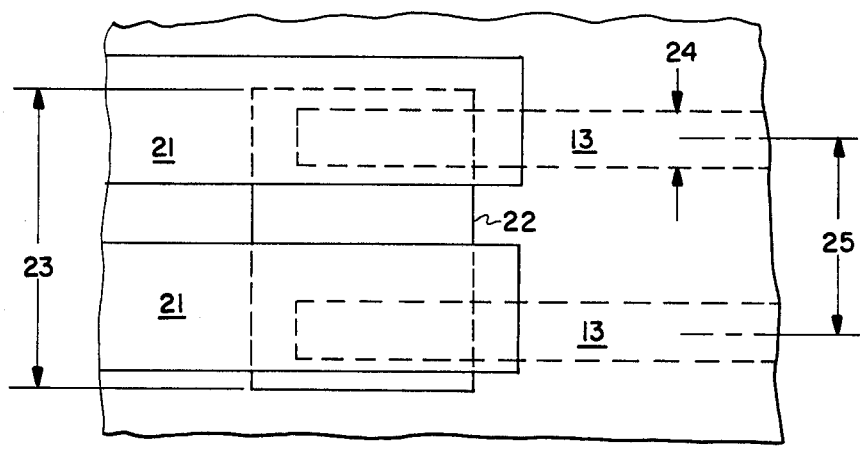
Figure 7:
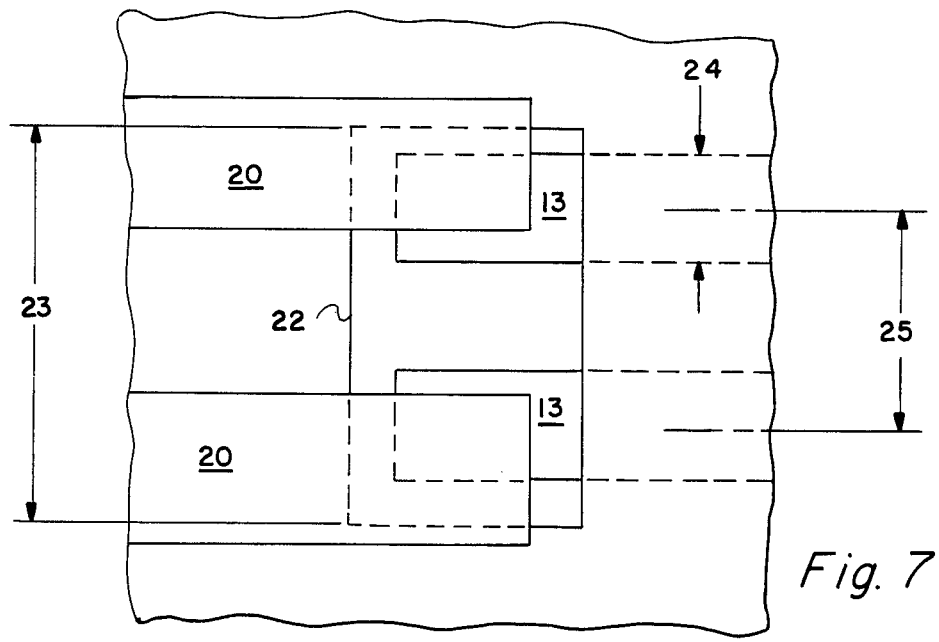

Via 22 may be etched sufficiently large to include more than one metalization interconnect 13 as illustrated in FIGS. 5 and 7. The approach of having one via 22 encompass more than one metalization interconnect 13 can be used to reduce cell spacing 25 between metalization interconnects.

Figure 3:
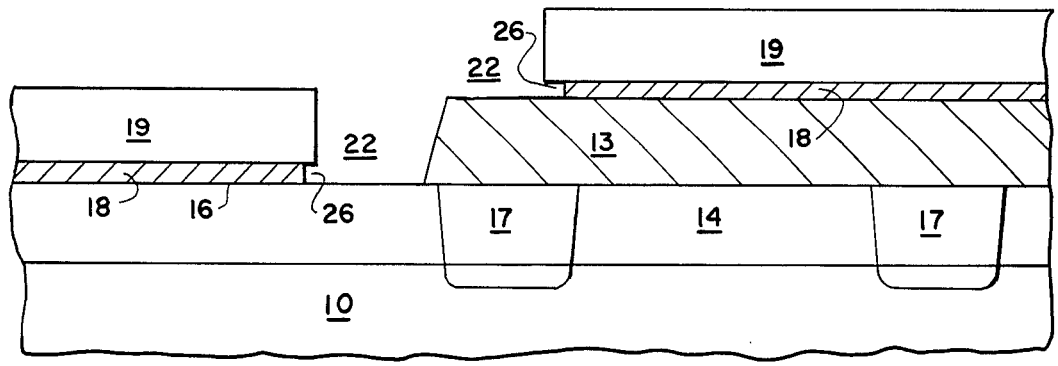

As illustrated in FIG. 3, via 22 is completed by plasma etching dielectric barrier material 18 using a second etch gas to remove material 18 in the area of the via. In the case of dielectric barrier material 18 comprising $Ti_xO_y$, the dielectric may be etched in $CCl_4$ plasma.

As was previously indicated, it is preferred that first thin film layer 18 comprising the dielectric barrier material be formed to a thickness of approximately 500 angstroms or less. This is preferred since in some cases a dielectric material such as 14 underlying layer 18 can be etched in the same etch gas as that used to remove layer 18 in the region of the via. Making layer 18 thin, e.g., 500 angstroms or less, will permit rapid removal of layer 18 in this region without substantial effect on an underlying dielectric layer such as 14.

Also, in situations where oversized via 22 is over a metalization interconnect such as 13, thin film layer 18 must be removed rapidly before the metalization interconnect is etched. In the case of an aluminum/copper interconnect such as 13, there is an initiation time for mature $Al_2O_3$ (not shown) which forms in the metalization to be removed (sputtered) away in the plasma etch, e.g., in a $CCl_4$ etch. Therefore, it is preferred to make layer 18 of a thickness of 500 angstroms or less in order to remove layer 18 during this initiation period in order to avoid attack of underlying metalization when removing layer 18 in the via being etched.

Further, making layer 18 thin minimizes undercutting 26 under layer 19 at the edges of via 22. If layer 18 is substantially increased in thickness, undesirable undercutting 26 may increase, thus forming regions which are difficult to metalize with the result of undesirable voids and cusping in the next layer of metalization.

It is also preferred that the dielectric passivating material comprising layer 19 have a high etch rate in the first etch, and that dielectric barrier material 18 not be appreciably affected by the first etch. This is the case, for example, when dielectric barrier material 18 comprises $Ti_xO_y$, dielectric passivating material 19 comprises $SiO_2$, the first etch comprises a gas mixture of 50% $CHF_3$:45.9% $CF_4$:4.1% $O_2$, and the second etch comprises $CCl_4$.

A second layer of metalization interconnects such as 21 (FIGS. 4 and 5) or 20 (FIGS. 6 and 7) may then be formed by standard processing techniques such as depositing a second layer of metal, photopatterning the second layer of metal, and etching the second layer of metal to form interconnects. A metalization interconnect from each of the first and second layers of metalization interconnects are connected in via 22 as illustrated in the Figures.

Figure 6:
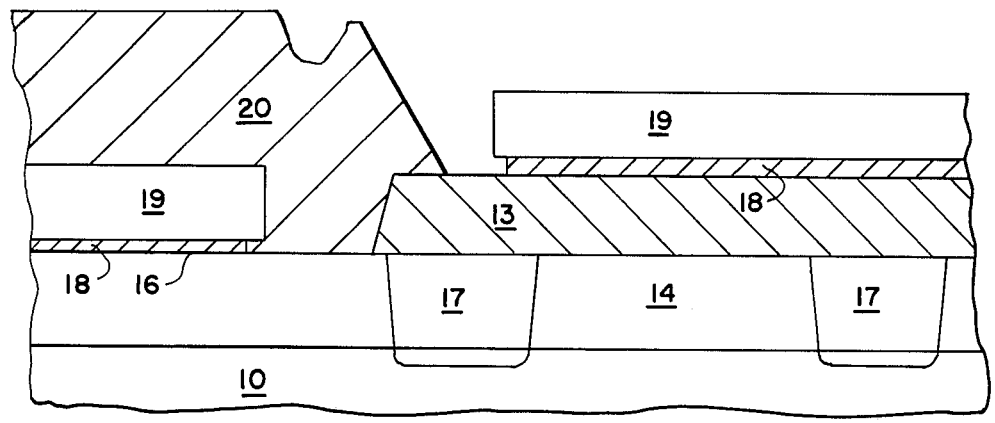

If a metal etch stop is not used between the first and second metalization layers (or if two dissimilar metals are not used in the layers as described below), the configuration of metalization interconnects 21 (illustrated in FIGS. 4 and 5) is preferred over the configuration of metalization interconnects 20 (illustrated in FIGS. 6 and 7).

Figure 4:
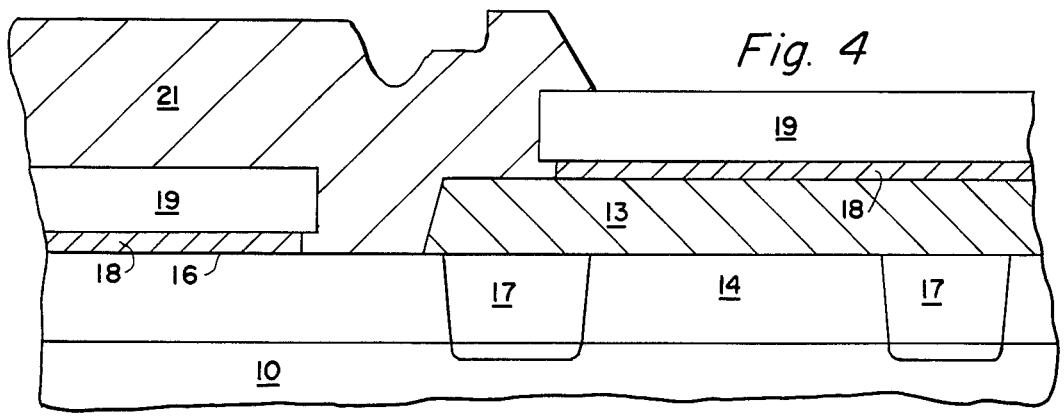

As can be seen in FIGS. 4 and 5, second layer metalization interconnects 21 completely cover first layer metalization interconnects 13 in via 22. Therefore, when etching second layer metalization interconnects 21 (i.e., the configuration illustrated in FIGS. 4 and 5), there will be no attack of first layer metalization interconnects 13 in via 22.

When forming metalization interconnects such as 20 (i.e., the configuration illustrated in FIGS. 6 and 7), an etch stop (not shown) must cover metal layer 13 when etching the second layer of metal; alternately, metal layer 13 may comprise a metal not appreciably etched by the etch gas used to etch the second layer of metal.

An integrated circuit formed in accordance with the present invention comprises thin film dielectric barrier material such as 18 located under a thin film dielectric passivating material such as 19. The circuit further comprises a via such as 22 formed into the two thin film layers over a metalization interconnect such as 13 which protrudes into the via. The metalization interconnect such as 13 protruding into the via has a width 24 less than the width 23 of the via. A second metalization interconnect such as 20 (FIG. 7) or 21 (FIG. 5) is connected to the first metalization interconnect in the via.

The processing steps described in the present application may be repeated to form additional layers of metalization, e.g., third and fourth layer metalizations. Such additional layers are desirable in modern day high density VLSI devices.

Those skilled in the art will recognize that the present invention is to be limited only in accordance with the scope of the claims, since others skilled in the art may devise other embodiments still within the limits of the claims. For example, the first dielectric barrier material may comprise materials other than the $Ti_xO_y$ material disclosed in the present application.

The embodiments of the invention in which an exclusive property or right is claimed are defined as follows:

1. A method of fabricating an integrated circuit comprising:
   providing a substrate comprising a semiconductor material and having a first surface;
   forming a first layer of metalization interconnects over the first surface, each interconnect having a width;
   depositing a first thin film layer comprising a dielectric barrier material directly onto the first layer of metalization interconnects and portions of the first surface which are free of the first layer of metalization interconnects;
   depositing a second thin film layer comprising a dielectric passivating material directly onto the first thin film layer of dielectric barrier material;
   plasma etching part of a via through the dielectric passivating material to the dielectric barrier material using a first etch gas to thereby expose a portion of the dielectric barrier material but which portion is free of any substantial etching, the via to have an extent greater than the width of a metalization interconnect;
   plasma etching the exposed portion of the dielectric barrier material through to the first layer of metalization interconnects using a second etch gas to remove this exposed portion of the dielectric barrier material to thereby complete the via; and
   forming a second layer of metalization interconnects, a metalization interconnect from each of the first and second layers of metalization interconnects being electrically connected in the via.

2. The method of claim 1 wherein the dielectric passivating material has a high etch rate in the first etch gas, the dielectric barrier material not being appreciably affected by the first etch gas.

3. The method of claim 2 wherein the first thin film layer comprising a dielectric barrier material is formed to a thickness of approximately 500 angstroms or less.

4. The method of claim 3 wherein the via is etched in the dielectric passivating material so that the area of the via overlies more than one first level metalization interconnect.

5. The method of claim 4 wherein the dielectric barrier material comprises $Ti_xO_y$ wherein x and y equal the relative amounts of Ti and O respectively.

6. The method of claim 5 wherein the dielectric passivating material comprises $SiO_2$.

7. The method of claim 6 wherein a metalization interconnect in the second layer completely overlies a first layer metalization interconnect in the via.

8. The method of claim 7 wherein the depositing and plasma etching steps are repeated to form at least one additional layer of metalization interconnects.

9. The method of claim 1 wherein the first thin film layer comprising a dielectric barrier material is formed to a thickness of approximately 500 angstroms or less.

10. The method of claim 9 wherein the via is etched in the dielectric passivating material so that the area of the via overlies more than one first level metalization interconnect.

11. The method of claim 10 wherein the dielectric barrier material comprises $Ti_xO_y$ wherein x and y equal the relative amounts of Ti and O respectively.

12. The method of claim 11 wherein the dielectric passivating material comprises $SiO_2$.

13. The method of claim 12 wherein a metalization interconnect in the second layer completely overlies a first layer metalization interconnect in the via.

14. The method of claim 13 wherein the depositing and plasma etching steps are repeated to form at least one additional layer of metalization interconnects.

15. The method of claim 1 wherein the via is etched in the dielectric passivating material so that the area of the via overlies more than one first level metalization interconnect.

16. The method of claim 15 wherein the dielectric barrier material comprises $Ti_xO_y$ wherein x and y equal the relative amounts of Ti and O respectively.

17. The method of claim 16 wherein the dielectric passivating material comprises $SiO_2$.

18. The method of claim 17 wherein a metalization interconnect in the second layer completely overlies a first layer metalization interconnect in the via.

19. The method of claim 18 wherein the depositing and plasma etching steps are repeated to form at least one additional layer of metalization interconnects.

20. The method of claim 1 wherein the dielectric barrier material comprises $Ti_xO_y$ wherein x and y equal the relative amounts of Ti and O respectively.

21. The method of claim 20 wherein the dielectric passivating material comprises $SiO_2$.

22. The method of claim 21 wherein a metalization interconnect in the second layer completely overlies a first layer metalization interconnect in the via.

23. The method of claim 22 wherein the depositing and plasma etching steps are repeated to form at least one additional layer of metalization interconnects.

24. The method of claim 1 wherein the dielectric passivating material comprises $SiO_2$.

25. The method of claim 24 wherein a metalization interconnect in the second layer completely overlies a first layer metalization interconnect in the via.

26. The method of claim 25 wherein the depositing and plasma etching steps are repeated to form at least one additional layer of metalization interconnects.

27. The method of claim 1 wherein a metalization interconnect in the second layer completely overlies a first layer metalization interconnect in the via.

28. The method of claim 27 wherein the depositing and plasma etching steps are repeated to form at least one additional layer of metalization interconnects.

29. The method of claim 1 wherein the depositing and plasma etching steps are repeated to form at least one additional layer of metalization interconnects.

* * * * *